(12) United States Patent
Elliott et al.

(10) Patent No.: US 7,875,952 B1
(45) Date of Patent: Jan. 25, 2011

(54) METHOD OF TRANSISTOR LEVEL HETEROGENEOUS INTEGRATION AND SYSTEM

(75) Inventors: Kenneth R. Elliott, Thousand Oaks, CA (US); Peter David Brewer, Westlake Village, CA (US); Yakov Royter, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 686 days.

(21) Appl. No.: 11/879,473

(22) Filed: Jul. 16, 2007

Related U.S. Application Data

(60) Provisional application No. 60/845,943, filed on Sep. 19, 2006.

(51) Int. Cl.
*H01L 21/44* (2006.01)
(52) U.S. Cl. ............... 257/499; 257/E21.603; 257/E27.012; 438/689
(58) Field of Classification Search .......... 257/499, 257/723, E27.012, E21.603, 488 M; 438/618, 438/689, 700, 109
See application file for complete search history.

(56) References Cited

U.S. PATENT DOCUMENTS

| | | |
|---|---|---|
| 4,912,844 A | 4/1990 | Parker |
| 5,161,093 A | 11/1992 | Gorczyca |
| 5,284,548 A | 2/1994 | Carey |
| 5,353,498 A | 10/1994 | Fillion |
| 5,485,038 A | 1/1996 | Licari |
| 5,545,291 A | 8/1996 | Smith |
| 5,609,907 A | 3/1997 | Natan |
| 5,751,018 A | 5/1998 | Alivisatos |
| 5,772,905 A | 6/1998 | Chou |
| 5,783,856 A | 7/1998 | Smith |
| 5,824,186 A | 10/1998 | Smith |
| 5,877,550 A | 3/1999 | Suzuki |
| 5,904,545 A | 5/1999 | Smith |
| 6,037,255 A | 3/2000 | Hussein |
| 6,096,386 A | 8/2000 | Biebuyck |
| 6,165,911 A | 12/2000 | Calveley |
| 6,294,741 B1 | 9/2001 | Cole |
| 6,326,058 B1 | 12/2001 | Biebuyck |
| 6,579,463 B1 | 6/2003 | Winningham |
| 6,586,338 B2 | 7/2003 | Smith |
| 6,656,568 B1 | 12/2003 | Winningham |
| 6,946,322 B2 | 9/2005 | Brewer |
| 6,974,604 B2 | 12/2005 | Hunter |
| 7,045,195 B2 | 5/2006 | Ozin |
| 7,223,635 B1 | 5/2007 | Brewer |
| 2002/0005294 A1 | 1/2002 | Mayer et al. |
| 2003/0140317 A1* | 7/2003 | Brewer et al. .......... 716/1 |

* cited by examiner

*Primary Examiner*—Thomas L Dickey
*Assistant Examiner*—Fazil Erdem
(74) *Attorney, Agent, or Firm*—George R. Rapacki; Daniel R. Allemeier

(57) ABSTRACT

The present invention relates to a process for fabricating integrated circuit system. More particularly, the process allows for fabrication of highly integrated system-on-a-chip modules through heterogeneous integration of different semiconductor technologies wherein alignment targets on the base semiconductor are used for precise lateral positioning of device structures above.

21 Claims, 4 Drawing Sheets

METHOD OF TRANSISTOR LEVEL HETEROGENEOUS INTEGRATION AND SYSTEM

CROSS-REFERENCE

The present application claims the benefit of Provisional Application No. 60/845,943 filed on Sep. 19, 2006. The present application is related to and commonly assigned patent application documents entitled "Process for Assembling Three-dimensional Systems on a Chip and Structure thus obtained," Ser. No. 10/256,336 filed on Sep. 26, 2002. The contents of this related application is herein incorporated by reference.

FIELD OF THE INVENTION

The current invention relates to processes for fabricating electronic circuit devices. More particularly, it relates to processes for fabricating highly integrated system-on-a-chip modules through heterogeneous integration of III-V integrated circuits with silicon technology.

BACKGROUND

Current methods for wafer-scale integration of different semiconductor technologies typically rely on either heteroepitaxy or wafer bonding techniques. However, both of these techniques are limited in the number of different devices and material systems that can be successfully integrated. Moreover, growth and fabrication procedures optimized for a single device technology often must be compromised to accommodate dissimilar material systems. This forces the costly development of customized processes for every component and prevents the use of low-cost foundries for producing the integrated systems.

In particular, the most basic process for wafer-scale integration is by heteroepitaxy combined with post-growth device processing. However, for the integration of a silicon substrate with group III-V semiconductor materials, components or devices, this process suffers from a large defect density caused by the mismatch in lattice parameters and by the fact that devices in the silicon substrate can only be fabricated through widely-separated "holes" in the epitaxial film. In addition, only one type of III-V layer can be utilized, which means that applications that could benefit from both Gallium Arsenide (GaAs) and Indium Phosphide (InP) devices are not feasible.

Somewhat greater flexibility can be achieved through the use of wafer bonding to join silicon and III-V wafers containing already fabricated devices. However, the large thermal expansion mismatch between III-V materials and silicon requires almost complete removal of the III-V substrate prior to interconnect formation or additional processing. A further disadvantage is that wafer bonding techniques can only be used to add a single type of III-V device to silicon. A variant of this approach is to use wafer bonding and layer separation techniques to transfer a thin layer of III-V material onto an already fabricated silicon integrated circuit wafer that has been overcoated with oxide and planarized. The transferred layer is then processed to form devices and interconnections. However, this approach also suffers from problems due to thermal expansion mismatch as well as thermal degradation of devices present in the silicon substrate during processing of the III-V layer.

For integration at the chip level, there are established methods that rely on surface-mounting techniques for attaching complete die assemblies using solder bumps or wire bonding. An advanced approach is the "flip-chip" technique that can support the integration of a wide variety of device technologies. However, flip-chip is limited to a two-dimensional planar geometry, resulting in large overall package size. Moreover, this technique is inefficient for the placement of large numbers of components, since placement is performed serially.

Technologies such as Low Temperature Co-fired Ceramics (LTCC) or High-Density Multilayer Interconnect (HDMI) are available for the formation of three-dimensional stacks of passive components. However, these technologies are not usable for three-dimensional integration of active devices. LTCC techniques require sintering at 850 degree C., which would destroy most processed semiconductor devices. The HDMI technique utilizes multiple levels of flexible polymer films to achieve layer-to-layer interconnects, but does not provide a method for incorporating active devices within a layer. Both LTCC and HDMI are inefficient for the placement of large numbers of components due to their serial nature.

Fluidic self-assembly is one of the latest techniques for mass assembly and integration of pre-fabricated circuits, devices and components from any materials technology onto host circuits. In particular, devices and components are delivered to the host circuits using a fluid transport process. Two different approaches are possible, which differ in the underlying mechanism used to locate, position and connect the components into the larger system. The first approach uses chemically-based driving forces to govern the assembly process like attraction, positioning, orientation, and ordering which are controlled by molecular interactions at the surfaces of the objects. The second approach uses gravitational forces and geometrical constrains like shaped components and complementarily shaped receptacle sites.

Both of these approaches have been used to integrate electronic devices into hybrid electronic systems. See, for example, "Self-Assembly of an Operating Electrical Circuit Based on Shape Complementarity and the Hydrophobic Effect," Advanced Materials, by A. Terfort and G. M. Whitesides, 1998, 10, No. 6, pp. 470-473, that is incorporated herein by reference. A disadvantage of the gravity-based assembly methods is that they are limited to single-layer structures. In fact, since this assembly method involves the filling of receptacle sites on a host substrate by shaped device blocks, it is limited to a two-dimensional assembly. The reason for this limitation is that device blocks must have an unobstructed access to the receptacle sites.

For the foregoing reasons, there is a need for a novel process for fabricating highly integrated systems-on-a-chip modules for a wide range of applications, through the heterogeneous integration of III-V integrated circuits with silicon technology.

SUMMARY

It is an object of the present invention to provide a process that differs substantially from conventional processes for fabricating highly integrated systems-on-a-chip modules for a wide range of applications.

The present invention is directed to a process that satisfies the need for a process of fabricating highly integrated circuit systems for a wide range of applications through the heterogeneous integration of a variety of integrated circuits, in particular, III-V integrated circuits with silicon technology.

Another object of the heterogeneous integration process according to the present invention is to permit a greater degree of design flexibility for systems-on-a-chip design.

A further object of the present invention allows ultra-dense interconnection between III-V integrated circuits and silicon devices with sub-micron scale via positioning accuracy and micron-level via pitch.

A still further object of the process according to the present invention has the inherent ability to achieve transistor-level integration of III-V and silicon technologies.

A still further object of the process according to the present invention enables precise lateral registry (approximately 0.25 micron) of vertically stacked III-V integrated circuits and silicon integrated circuits.

Another object is that, according to the present invention, the accurate alignment achieved by the process embodiment in the present invention allows accurate positioning of thermal vias for optimum thermal management of high performance III-V devices.

Yet another object of the present invention is to allow the use of ultra-thin III-V integrated circuit layers with integrated heat spreaders to fabricate system-on-a-chip modules which have excellent electrical, thermal, and mechanical robustness.

A further object of the process according to the present invention is that the layer-to-layer alignment of III-V and silicon layers is not limited by wafer expansion mismatch during bonding.

Another object is that, according to the present invention, the wafer sizes of the III-V and silicon layer can be different.

A still further object is that the process according to the present invention improves yield and reduces cost as a result of process simplification, complexity reduction, and potential for increased wafer size.

Moreover, a further object is that the method according to the present invention allows the fabrication of system-on-a-chip module using commercially available die.

According to a first embodiment, a process for fabricating an integrated circuit system, the process comprising the steps of: providing a host circuit substrate having at least one host circuit, at least one first thermal vias, and a plurality of alignment targets forming a perimeter; providing an active device material block; bonding the active device material block to the host circuit substrate by a dielectric bonding layer disposed on the host circuit substrate; removing a growth substrate from the active device material block; and fabricating one or more active device structures on the active device material block.

According to the first embodiment, the host circuit substrate may be silicon substrate. The active device material block may comprises an etch stop layer, at least one III-V material active layer, and a heat spreader. The step of fabricating one or more active device structures utilizes the plurality of alignment targets to position the one or more active device structures. The one or more active device structures are lithographically fabricated.

According to a second embodiment, an integrated circuit system comprising: a host circuit substrate having at least one host circuit, at least one first thermal vias and a plurality of alignment targets; a dielectric layer disposed on the host circuit substrate; an active device material block disposed on the dielectric layer, the active device material block comprising one or more active device structures and at least one second thermal vias; one or more first interconnects connecting the one or more active device structures to the at least one host circuit; and one or more second interconnects connecting the plurality of first thermal vias to the plurality of second thermal vias, whereby the plurality of alignment targets are utilized to position the one or more active device structures, the one or more first interconnects and the one or more second interconnects during fabrication.

According to the second embodiment, the active device material block may comprises a growth substrate being removed after the active device material block is bonded to the host circuit substrate, an etch stop layer, at least one active layer and a heat spreader. The at least one active layer may be III-V semiconductor material. The host circuit substrate may be silicon substrate. The dielectric layer may be spin-on glass or BCB-based polymer. The one or more active device structures are lithographically fabricated. The integrated circuit system may be system-on-a-chip.

According to a third embodiment, a process for fabricating an integrated circuit system, the process comprising the steps of: providing a host circuit substrate having at least one host circuit, at least one first thermal vias, and a plurality of alignment targets; providing an active device material block; bonding the active device material block to the host circuit substrate by a dielectric bonding layer disposed on the host circuit substrate; removing a growth substrate from the active device material block; fabricating one or more active device structures on the active device material block; fabricating at least one first interconnection between the one or more active device structures and the at least one host circuit; fabricating at least one second thermal vias in the active device material block; and fabricating at least one second interconnection between the plurality of first thermal vias and the plurality of second thermal vias, wherein the plurality of alignment targets are used for the lateral positioning of the one or more active device structures, the at least one first interconnection, the plurality of second thermal vias, and the at least one second interconnection.

According to the third embodiment, the integrated circuit system is system-on-a-chip (SOC). The host circuit substrate may be silicon substrate. The active device material block may comprise III-V material.

DESCRIPTION OF THE DRAWINGS

The present invention will be understood and appreciated more fully from the following detailed description taken in conjunction with the drawings described below.

DESCRIPTION

Figure 1:
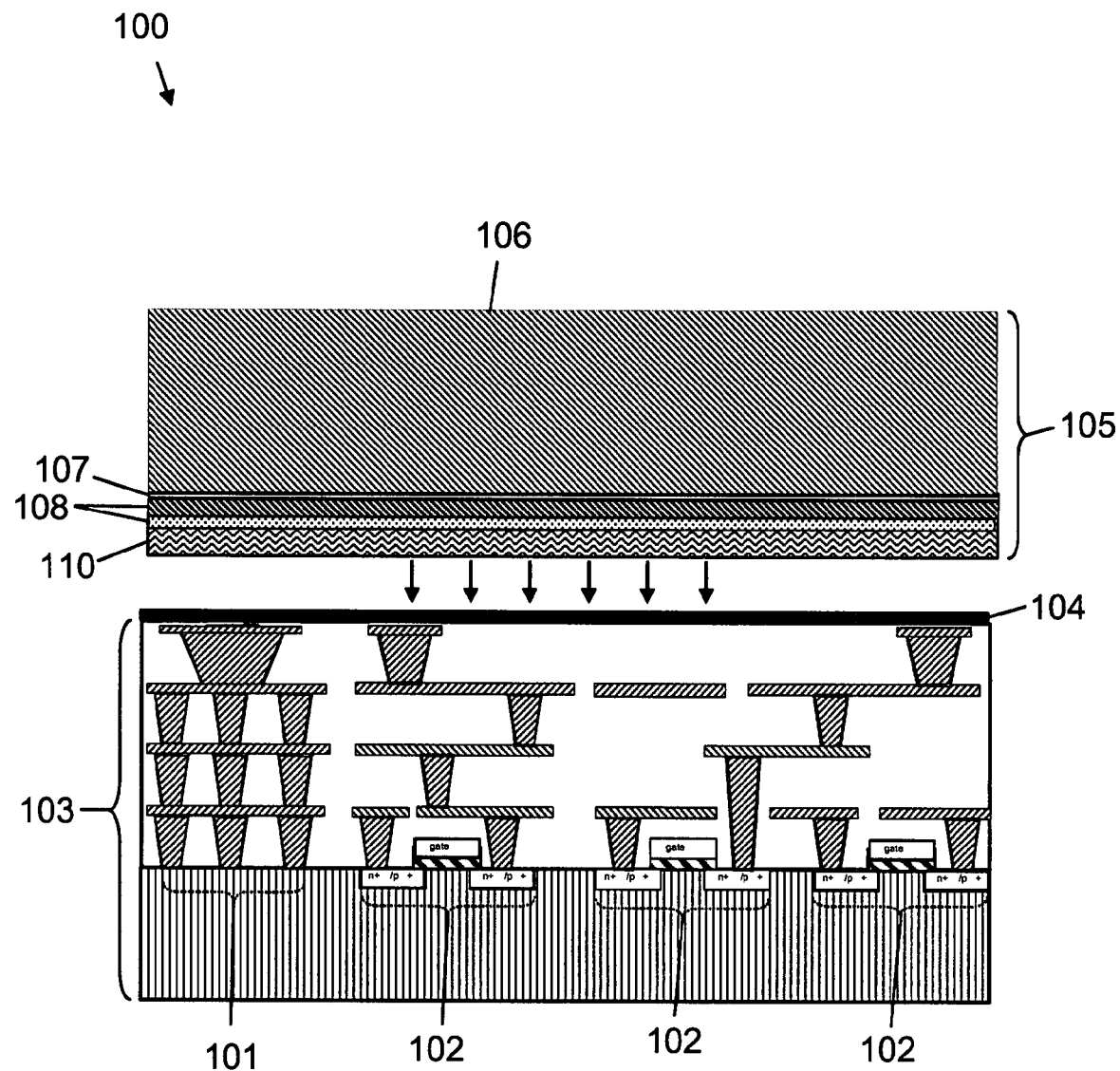
FIG. 1 schematically illustrates an individual step of fabricating silicon CMOS integrated circuits on a base silicon wafer and disposing an III-V semiconductor epilayer material block on the base silicon wafer.

The present invention will now be described more fully hereinafter with reference to the accompanying drawings, in which preferred embodiments of the invention are shown. This invention may be embodied in many different forms and should not be construed as limited to the embodiments set forth herein. Further, the dimensions of layers and other elements shown in the accompanying drawings may be exaggerated to more clearly show details. The present invention should not be construed as being limited to the dimensional relations shown in the drawings, nor should the individual elements shown in the drawings be construed to be limited to the dimensions shown. Moreover, the invention is not limited to the features depicted in the drawings as other devises with other features can be developed.

The present invention discloses a novel method for the fabrication of highly integrated circuits such as systems-ona-chip (SOC) modules for RF, optoelectronic, and sensor applications, through the heterogeneous integration of different semiconductor materials. A non-limiting example of such heterogeneous integration combines III-V material integrated circuits with silicon CMOS integrated circuits.

According to the present invention, a unique integration process enables the precise lateral registry (approximately ±0.25 micron) of a vertically stacked integrated circuit such as III-V integrated circuit on a base integrated circuit such as silicon CMOS integrated circuit. This high degree of alignment accuracy enables a number of key advancements for systems-on-a-chip technology such as RF system, Optoelectronic and sensors.

These key advancements include: ultra-dense interconnection between integrated circuits of different materials such as III-V and silicon devices; sub-micron via positioning accuracy and micron-level via pitch, transistor-level integration of III-V and silicon CMOS technologies, accurate positioning of thermal vias for optimum thermal management of high performance III-V devices, and addition of thermal spreading layers prior to bonding to improve thermal performance. The present invention also overcomes limitations of other prior art integration schemes by employing ultra-thin III-V integrated circuit layers with integrated heat spreaders. This provides excellent electrical, thermal, and mechanical robustness for a system-on-a-chip configuration.

A further aspect of the present invention is a novel approach to integrating mixed-semiconductor integrated circuit technologies and differs from prior art discussed in the literature in terms of vastly improved alignment accuracy between vertically stacked circuit elements. This allows the fabrication of III-V devices on silicon CMOS technology with unprecedented mixed-signal Figures-of-Merit (FOM) due to the intimate integration between the different technologies.

In comparison to other integration techniques, some of the innovative benefits of the present invention can be summarized as follows: overlay accuracy only limited by the lithographic tools that will scale as device sizes shrink; excellent layer-to-layer alignment, not limited by wafer expansion mismatch during bonding; straightforward thinning after attachment to less than 10 μm for excellent vertical thermal conductivity and high density interlayer vias; the ability to mix-and-match wafer sizes between silicon and III-V technology (e.g. 8-in Si and 3-in InP); the potential for intimately integrating multiple III-V device types and materials with silicon integrated technology; improved yield and reduced cost for a given function as a result of process simplification, complexity reduction, and potential for increased wafer size; ultra-low thermal resistance and superior electrical, thermal and mechanical robustness through the use of ultra-thin integrated circuit layers; circuitry with up to 400 GHz InP HBT transistors for gain and frequency margin, complexity, and flexibility coupled with ultra-high density silicon CMOS technology; potential for incorporation of commercially available die; and high speed assembly of pre-screened material and batch processing.

Furthermore, the present invention facilitates the fabrication of system-on-a-chip integrated circuits with superior dynamic range and bandwidth at lower power than existing prior art approaches. The present invention also has applications to advanced Digital-To-Analog converters design. The present invention enables chip-based solutions that can provide substantial enhancement to system capabilities as III-V integrated circuit technologies are scaled to smaller dimensions or new device types based on quantum effects or tunneling are developed.

In one embodiment of the present invention, it discloses a process for fabricating three-dimensional systems-on-a-chip configured circuits utilizing stacked III-V semiconductor integrated circuits and silicon CMOS integrated circuit technologies. The present invention provides an intimate integration process that enables the precise lateral positioning of the III-V integrated circuit relative to an underlying silicon CMOS integrated circuit. In this embodiment, III-V epilayer material blocks are initially mechanically positioned (10-100 micron resolution) over each reticle of the base silicon CMOS wafer and then in subsequent processing steps the III-V integrated circuit components are precisely aligned to the underlying silicon CMOS integrated circuits with lithographic-like accuracy (approximately 0.25 micron).

In the following, a sequence of four fabrication steps illustrating one embodiment of the present invention will be described using III-V devices and silicon base wafer.

An exemplary integration process flow for fabricating III-V devices on silicon base wafer to fabricate SOCs is shown schematically in FIGS. 1, 2, 3 and 4. The process comprises four processing steps.

In a first step 100 as illustrated in FIG. 1, a plurality of CMOS integrated circuits 102 are fabricated on a base silicon wafer 103. At least one first thermal vias 101 are fabricated. At least one dielectric bonding layer 104 is disposed on the silicon wafer 103. In addition, it is provided at least one III-V semiconductor epilayer material block 105 comprising a second substrate 106, an etch stop layer 107, at least one active layer 108 and an optional heat spreader layer 110.

Figure 2:
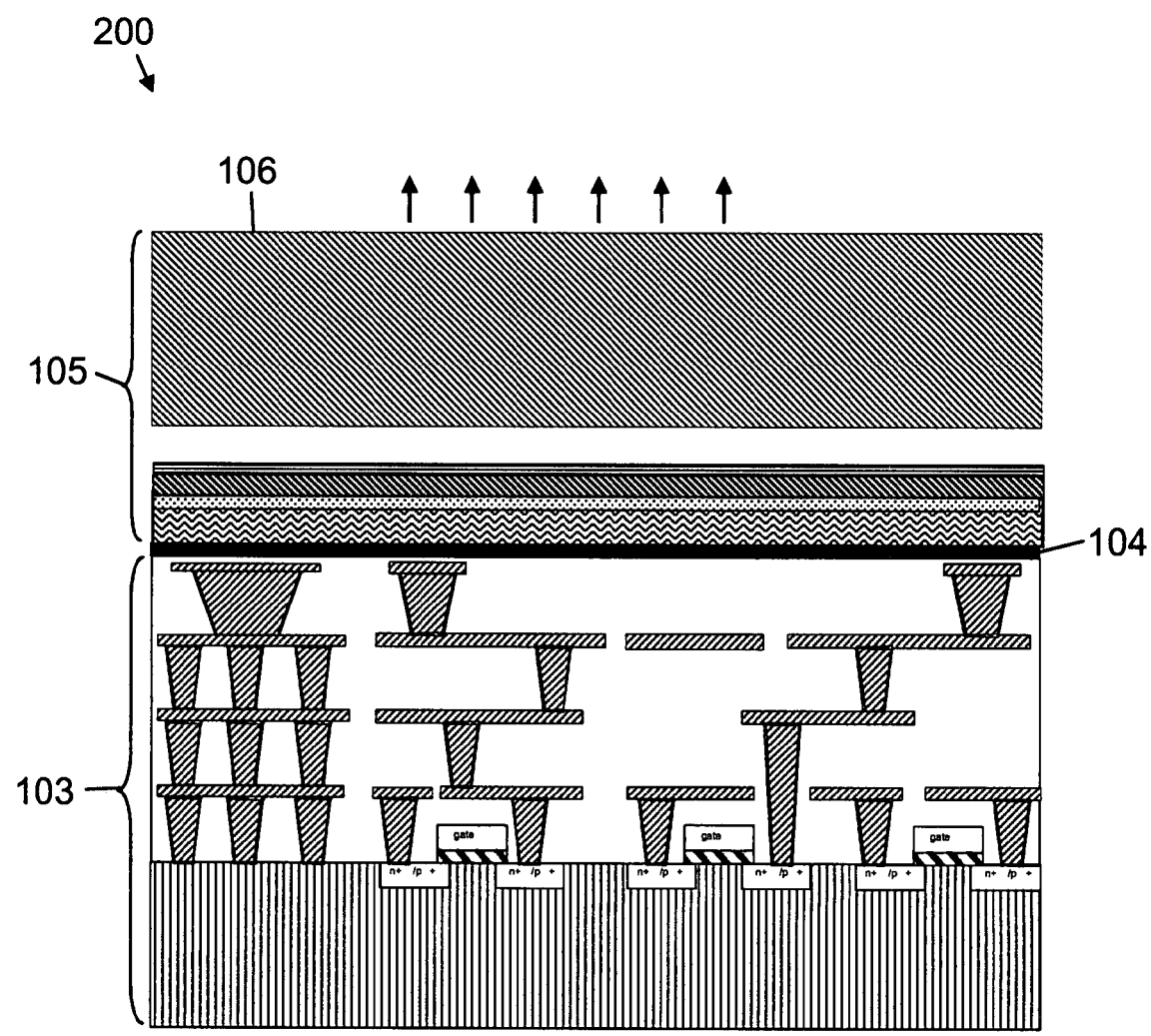
FIG. 2 schematically illustrates an individual step of mechanically placing and bonding of an III-V epilayer material block to a base silicon wafer using thin, dielectric bonding layer.

In a second step 200 as illustrated in FIG. 2, the at least one III-V semiconductor epilayer material block 105 (as shown in FIG. 1) are disposed and bonded to the base silicon wafer 103 using the at least one dielectric bonding layer 104. Non-limiting examples of the dielectric bonding layer 104 are CYCLOTENE (BCB-based polymer) and spin-on glass. CYCLOTENE is a Trademark of the Dow Chemical Company ("Dow") or an affiliated company of Dow. The second substrate 106 is then removed from the at least one III-V semiconductor epilayer material block 105.

Figure 3:
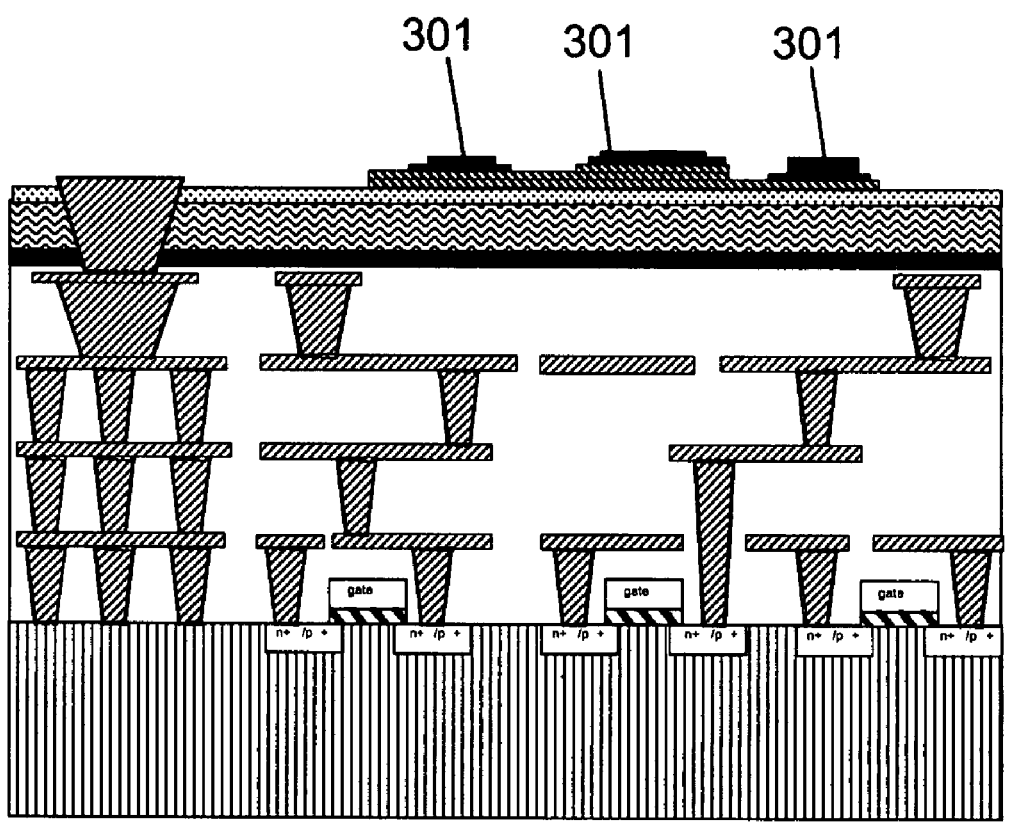
FIG. 3 schematically illustrates an individual step of removing an original growth substrate from a device epilayer material block.

In a third step 300 as illustrated in FIG. 3, at least one III-V semiconductor device structure 301 is fabricated.

Figure 4:
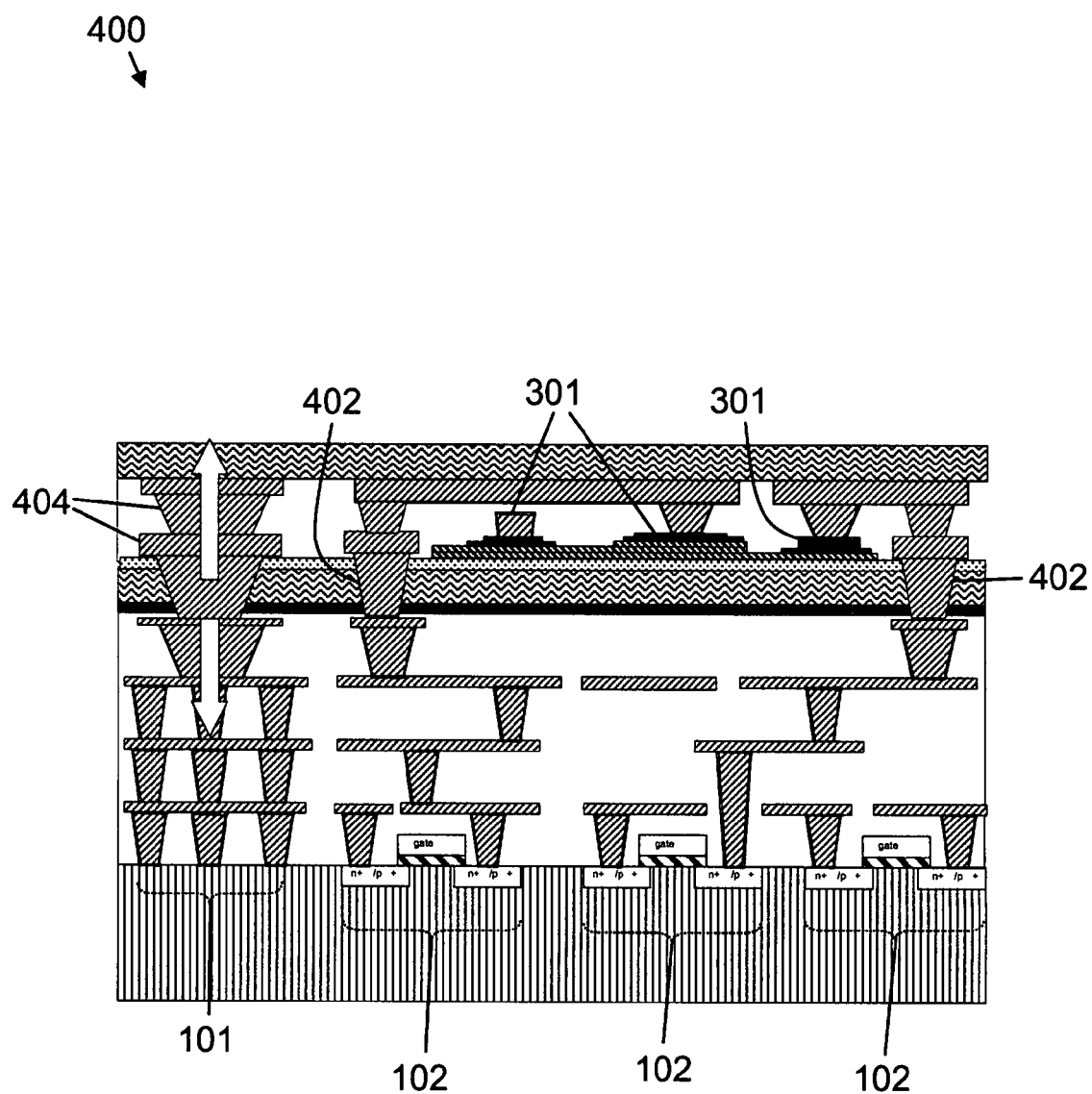
FIG. 4 shows a schematical cross-sectional view of an integrated circuit according to the present invention.

In a fourth step 400 as illustrated in FIG. 4, at least one interlayer interconnection 402 is fabricated to connect the at least one III-V semiconductor device structure 301 to the plurality of CMOS integrated circuits 102. At least one second thermal via 404 is fabricated and connected to the plurality of first thermal vias 101.

The key to fabricating a highly-aligned III-V on silicon CMOS configured SOC is the utilization of alignment targets of the base silicon wafer to define the position of the overlying III-V integrated circuits. This critical alignment is accomplished by employing undersized III-V device blocks that fit within confines of the silicon reticle. This permits the underlying alignment targets of the silicon CMOS integrated circuit wafer to be visible to the lithographic stepper for aligning the III-V semiconductor epilayer material blocks. The relative positioning of the III-V circuit components and the via interconnections are thus set by the limitation defined by the optical lithography technology and not by the tolerance of the initial mechanical alignment of the III-V block on the silicon wafer reticles (~10-100 microns). In practice, 0.25 micron alignment accuracy can be achieved using this integration process embodied in the present invention.

Another feature of the process embodied in the present invention is that high accuracy is achieved for each reticle over the entire silicon wafer since each III-V and silicon CMOS reticle is individually addressed by the stepper. Thus issues such as run-out commonly observed in contact lithography or in wafer bonding does not affect the process of the present invention.

Yet another feature of the present invention is the ability to integrate device technologies that originate on different size wafers. For example, the III-V wafer can be 3-4" and the Si wafer is 8-12". Furthermore, the use of islands of thinned III-V integrated circuit layers also mitigates the effects of thermal expansion differences between the III-V (for example, InP TCE: 4.8×10-6) and silicon (Si has TCE: 2.6× 10-6) circuit components and also significantly reduces temperature-induced strain. Thermal expansion effects can adversely affect the alignment accuracy of the two integrated circuit layers across the wafer.

Although the present invention has been described in considerable detail with reference to certain preferred versions thereof, other versions are possible. Therefore, the spirit and scope of the appended claims should not be limited to the description of the preferred versions contained herein.

What is claimed is:

1. A process for fabricating an integrated circuit system, the process comprising the acts of:
   receiving a host circuit substrate having at least one host circuit, at least one first thermal vias, and a plurality of alignment targets forming a perimeter;
   receiving an active device material block;
   bonding the active device material block to the host circuit substrate by a dielectric bonding layer disposed on the host circuit substrate; then
   removing a growth substrate from the active device material block; and then fabricating lithographically one or more active device structures on the active device material block utilizing the plurality of alignment targets for positioning the one or more active device structures.

2. The process of claim 1 further comprising the acts of: forming at least one first interconnection between the one or more active device structures and the at least one host circuit; fabricating at least one second thermal vias in the active device material block; and fabricating at least one second interconnection between the at least one first thermal vias and the at least one second thermal vias.

3. The process of claim 1, wherein the host circuit substrate is silicon substrate.

4. The process of claim 1, wherein the active device material block comprises: an etch stop layer, at least one III-V material active layer and a heat spreader.

5. The process of claim 1, wherein the dielectric bonding layer is spin-on glass.

6. The process of claim 1, wherein the dielectric bonding layer is BCB-based polymer.

7. The process of claim 1, wherein the active device material block is bonded to the host circuit substrate within the perimeter.

8. The process of claim 7, wherein the active device material block is smaller laterally then the perimeter.

9. The process of claim 1, wherein the integrated circuit system is System-on-a-chip (SOC).

10. An integrated circuit system comprising:
    a host circuit substrate having at least one host circuit, at least one first thermal vias and a plurality of alignment targets;
    a dielectric layer disposed on the host circuit substrate;
    an active device material block disposed on the dielectric layer, the active device material block comprising one or more active device structures and at least one second thermal vias;
    one or more first interconnects connecting the one or more active device structures to the at least one host circuit; and
    one or more second interconnects connecting the at least one first thermal vias to the at least one second thermal vias, whereby the plurality of alignment targets are utilized to position the one or more active device structures, the one or more first interconnects and the one or more second interconnects within a tolerance of 0.25 micrometers during fabrication.

11. The integrated circuit system of claim 10, wherein the active device material block comprises a growth substrate being removed after the active device material block is bonded to the host circuit substrate, an etch stop layer, at least one active layer and a heat spreader.

12. The integrated circuit system of claim 11, wherein the at least one active layer is III-V semiconductor material.

13. The integrated circuit system of claim 10, wherein the host circuit substrate is silicon substrate.

14. The integrated circuit system of claim 10, wherein the dielectric layer is spin-on glass.

15. The integrated circuit system of claim 10, wherein the dielectric layer is BCB-based polymer.

16. The integrated circuit system of claim 10, wherein the one or more active device structures are lithographically fabricated.

17. The integrated circuit system of claim 10, wherein the integrated circuit system is system-on-a-chip (SOC).

18. A process for fabricating an integrated circuit system, the process comprising the acts of:
    receiving a host circuit substrate having at least one host circuit, at least one first thermal vias, and a plurality of alignment targets;
    receiving an active device material block; then
    bonding the active device material block to the host circuit substrate by a dielectric bonding layer disposed on the host circuit substrate; then
    removing a growth substrate from the active device material block; then
    fabricating one or more active device structures on the active device material block;
    fabricating at least one first interconnection between the one or more active device structures and the at least one host circuit;
    fabricating at least one second thermal vias in the active device material block; and
    fabricating at least one second interconnection between the at least one first thermal vias and the at least one second thermal vias, wherein the plurality of alignment targets are used for the lateral positioning of the one or more active device structures, the at least one first interconnection, the at least one second thermal vias, and the at least one second interconnection.

19. The process for fabricating an integrated circuit system of claim 18, wherein the integrated circuit system is system-on-a-chip (SOC).

20. The process for fabricating an integrated circuit system of claim 18, wherein the host circuit substrate is silicon substrate.

21. The process for fabricating an integrated circuit system of claim 18, wherein the active device material block comprises III-V material.

* * * * *